United States Patent
Fujii et al.

(10) Patent No.: US 10,607,876 B2
(45) Date of Patent: Mar. 31, 2020

(54) METHOD FOR PROCESSING MOLD MATERIAL AND METHOD FOR MANUFACTURING STRUCTURAL BODY

(71) Applicant: Tokyo Ohka Kogyo Co., Ltd., Kawasaki-shi (JP)

(72) Inventors: Yasushi Fujii, Kawasaki (JP); Akihiko Nakamura, Kawasaki (JP); Yasumasa Iwata, Kawasaki (JP); Shingo Ishida, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 107 days.

(21) Appl. No.: 14/270,086

(22) Filed: May 5, 2014

(65) Prior Publication Data
US 2014/0332149 A1  Nov. 13, 2014

(30) Foreign Application Priority Data
May 9, 2013  (JP) ................................. 2013-099658

(51) Int. Cl.
*H01L 21/00* (2006.01)
*H01L 21/683* (2006.01)
*H01L 23/00* (2006.01)
*H01L 21/56* (2006.01)

(52) U.S. Cl.
CPC ........ *H01L 21/6835* (2013.01); *H01L 21/568* (2013.01); *H01L 24/96* (2013.01); *H01L 2221/68318* (2013.01); *H01L 2221/68327* (2013.01); *H01L 2221/68381* (2013.01); *H01L 2924/12042* (2013.01); *H01L 2924/3511* (2013.01)

(58) Field of Classification Search
CPC ............ B29C 2035/0283; B29C 39/42; B29C 41/50; B29C 37/006; H01L 21/56–568
See application file for complete search history.

(56) References Cited

U.S. PATENT DOCUMENTS 5,257,491 A * 11/1993 Rouyer ................. B29B 13/022
                                                                    206/447
5,344,604 A *  9/1994 Kusek .................... B29B 13/06
                                                                    264/272.11
(Continued)

FOREIGN PATENT DOCUMENTS

EP      0 919 363 A1    6/1999
GB       674519 A  *    6/1952 ............. B29C 39/42
(Continued)

OTHER PUBLICATIONS

Adhesives Research, Inc., "ARclad® IS-7876 Silicone Transfer Adhesive Product Information", 2012, available at http://www.adhesivesresearch.com/wp-content/uploads/2013/10/7876-Data-Sheet.pdf, 2 pages.*
(Continued)

*Primary Examiner* — Linda L Gray
(74) *Attorney, Agent, or Firm* — Knobbe, Martens, Olson & Bear LLP (57) ABSTRACT

A method for processing a mold material which includes a heating step of heating a mold material layer formed of the mold material to discharge gas from the mold material constituting the mold material layer.

18 Claims, 1 Drawing Sheet

(56) References Cited

U.S. PATENT DOCUMENTS

| | | | | |
|---|---|---|---|---|
| 6,027,958 | A * | 2/2000 | Vu | H01L 21/568 257/679 |
| 6,093,583 | A * | 7/2000 | Mukerji | H01L 21/56 257/E21.502 |
| 9,048,311 | B2 * | 6/2015 | Inao | H01L 21/6835 |
| 2002/0159242 | A1 | 10/2002 | Nakatani et al. | |
| 2003/0011738 | A1 * | 1/2003 | Akiyama | H01L 21/6835 349/156 |
| 2004/0101688 | A1 * | 5/2004 | Rubinsztajn | C08L 63/00 428/413 |
| 2006/0194064 | A1 * | 8/2006 | Xiao | C08G 59/5093 428/414 |
| 2006/0220262 | A1 | 10/2006 | Meyer et al. | |
| 2007/0275507 | A1 * | 11/2007 | Muraki | B29C 33/10 438/127 |
| 2008/0128884 | A1 | 6/2008 | Meyer et al. | |
| 2009/0224402 | A1 * | 9/2009 | Do | H01L 21/568 257/738 |
| 2011/0117702 | A1 | 5/2011 | Rietzler et al. | |
| 2011/0143501 | A1 * | 6/2011 | Oda | C08L 63/00 438/127 |
| 2011/0272800 | A1 | 11/2011 | Chino | |
| 2012/0135096 | A1 | 5/2012 | Maeyama et al. | |
| 2013/0113091 | A1 * | 5/2013 | Meng | H01L 21/561 257/734 |
| 2013/0244377 | A1 * | 9/2013 | Arimitsu | H01L 24/96 438/118 |

FOREIGN PATENT DOCUMENTS

| | | | | |
|---|---|---|---|---|
| JP | S56-163438 | A | | 12/1981 |
| JP | h11-58604 | A | | 3/1999 |
| JP | 2001-118965 | A | | 4/2001 |
| JP | 2005183689 | A | * | 7/2005 |
| JP | 2006-287235 | | | 10/2006 |
| JP | 2007-129077 | A | | 5/2007 |
| JP | 2009-289985 | A | | 12/2009 |
| JP | 2010-056409 | A1 | | 3/2010 |
| JP | 2011-238767 | | | 11/2011 |
| JP | WO 2012056803 | A1 * | 5/2012 | ......... H01L 21/6835 |
| JP | 2012-126074 | | | 7/2012 |

OTHER PUBLICATIONS

Biondi, M.A., and A.I. Guobadia, "Infrared Absorption of Aluminum, Copper, Lead, and Nickel at 4.2° K", Physical Review, vol. 166, No. 3, Feb. 15, 1968, pp. 667-673 (Year: 1968).*

Machine translation of Japanese Patent Publication No. JP-2005183689A, originally published Jul. 7, 2005, 28 pages (Year: 2005).*

Notice of Rejection dated by Japan Patent Office Dec. 20, 2016 in the corresponding Japanese patent application No. 2013-099658.

\* cited by examiner

METHOD FOR PROCESSING MOLD MATERIAL AND METHOD FOR MANUFACTURING STRUCTURAL BODY

CROSS-REFERENCE TO RELATED APPLICATIONS

The present application claims priority under 35 U.S.C. § 119 (a)-(d) to Japanese Patent Application No. 2013-099658, filed May 9, 2013, the content of which is incorporated herein by reference.

BACKGROUND OF THE INVENTION

Field of the Invention

The present invention relates to a method for processing a mold material and a method for manufacturing a structural body.

Background Art

In JP-A-2012-126074 (publication date: Jul. 5, 2012), a resin molding apparatus in which a workpiece having a semiconductor chip held on a carrier plate is carried in a press portion together with a resin to be resin-molded is described.

In JP-A-2006-287235 (publication date: Oct. 19, 2006), a package of a die is described. Specifically, in JP-A-2006-287235, it is described that after the die is placed on a carrier plate and is molded using a molding enclosure, a mold compound is removed from a rear surface of the die, and the rear surface of the die is polished in order to make a thickness of the die thin.

SUMMARY OF THE INVENTION

However, in some cases, devices such as a chip, and elements such as a die are placed on a mold material, and processed. When a support is adhered to the mold material by heating before the processing, heat is added to the mold material, and gas is generated from the mold material. Therefore, there is a problem in that an adverse effect in which the support and the mold material are adhered to each other without sufficient strength occurs.

The present invention has been made in consideration of the above problem, and an object thereof is to provide a method for processing the mold material for reducing the adverse effect due to the generation of gas when adhering in the mold material to which a support is adhered in order to perform a processing after mounting a workpiece member such as devices or elements.

A method for processing the mold material according to the present invention includes heating a mold material layer formed of the mold material to discharge gas from the mold material constituting the mold material layer.

According to the present invention, an effect is exhibited that an adverse effect due to generation of gas when adhering can be reduced in a mold material to which a support is adhered in order to perform a processing after mounting a workpiece member such as devices or elements.

DETAILED DESCRIPTION OF THE INVENTION

Method for Processing Mold Material

A method for processing the mold material according to the present invention includes a heating step in which a mold material layer formed of the mold material is heated, and gas is discharged from the mold material constituting the mold material layer.

Mold Material

In the method for processing the mold material according to the present invention, the mold material to be processed is not particularly limited. The method for processing the mold material according to the present invention can be applied to various mold materials.

In the method for processing the mold material according to the present invention, before adhering the support, gas is discharged from the mold material in advance, and thus, adverse effects with respect to the adhesion is reduced.

The mold material layer is a layer formed of the mold material. The method for processing the mold material according to the present invention can be applied to those including only the mold material layer, for example, the mold material of a plate shape, and also a laminated plate in which the mold material layer is formed on the substrate such as glass or silicon.

Heating Step

In the heating step, the mold material layer may be heated such that gas is discharged from the mold material constituting the mold material layer. Thus, since gas is discharged, it is possible to prevent gas from being generated when the support is adhered, and it is possible to reduce the adverse effect that occurs when adhering.

A heating temperature may be suitably set according to the type of the mold material, and for example, is 100° C. or higher and 250° C. or lower, and preferably 220° C. or lower. A heating time is, for example, 15 minutes or more, and preferably 1 hour or more. As a more specific example, it is possible to discharge gas without rapidly generating a warpage by heating while slowly raising the temperature in the range of 120° C. to 160° C. for a long period of time (1 hour or longer). In addition, it is found that by heating for 15 minutes or more at 215° C., discharge of gas hardly occurs.

The heating step may be performed in an environment under the atmospheric pressure, under a reduced pressure environment whose pressure is lower than the atmospheric pressure, and it is more preferable that the mold material be heated under the reduced pressure environment whose pressure is lower than the atmospheric pressure. Thus, the efficiency of discharging gas from the mold material is improved.

Workpiece Member

The workpiece member to be processed may be placed on the surface of the mold material layer.

The workpiece member is a member to which any processing will be added after the method for processing the mold material according to the present invention is performed on the mold material layer. Specific examples of the workpiece member include devices such as a chip, and elements such as a die. For example, when the mold material layer is provided on the substrate such as glass or silicon, devices such as a chip may be placed, and in a case of the mold material layer only, the elements such as a die may be placed. In addition, as any processing, for example, processings such as thinning of the device, the element and the like can be exemplified.

Adhesive Layer Forming Step

The method for processing the mold material according to the present invention may include an adhesive layer forming step in which the adhesive layer is provided on the surface of the mold material layer after the heating step. For example, it is possible to perform various processings after adhering, for example, the support on a surface different from the mold material layer in the adhesive layer.

As the method for forming the adhesive layer, an adhesive may be coated on the mold material, the adhesive is coated on the support which is adhered to the mold material, and an adhesive tape of which both surfaces are coated with the adhesive may be adhered to the substrate or the mold material. In a case where the workpiece member is placed on the mold material layer, the adhesive may be coated from the top of the workpiece member. In a case where the adhesive is coated on the support, the adhesive may be coated from the top of a release layer when the release layer is provided on the support. The method for coating the adhesive is not particularly limited, and coating methods such as a spin coating method, a dipping method, a roller blade method, a doctor blading method, a spraying method, a slit nozzle method can be exemplified. In addition, after the adhesive is coated, it may be dried by heating.

The thickness of the adhesive layer may be suitably determined depending on the type of the support to be adhered, a processing to be performed on a laminate after adhesion, is preferably in the range of 10 µm to 300 µm, and more preferably in the range of 70 µm to 200 µm.

Adhesive

As the adhesive, for example, various adhesives known in the related art such as an acrylic adhesive, a novolac adhesive, a naphthoquinone adhesive, a hydrocarbon adhesive, a polyimide adhesive, an elastomer can be used as an adhesive constituting the adhesive layer.

The resin contained in the adhesive layer is not limited as long as it has an adhesive property, and a hydrocarbon resin, an acrylic-styrene-based resin, maleimide-based resin, an elastomer resin, or a combination thereof can be exemplified.

Hydrocarbon Resin

The hydrocarbon resin is a resin having a hydrocarbon skeleton and formed by polymerizing a monomer component. Examples of the hydrocarbon resin include a cycloolefin-based polymer (hereinafter, also referred to as "resin (A)"), or at least one resin (hereinafter, also referred to as "resin (B)") selected from the group consisting of a terpene-based resin, a rosin-based resin and a petroleum-based resin, but are not limited thereto.

The resin (A) may be a resin formed by polymerizing a monomer component including a cycloolefin-based monomer. Specifically, a ring-opened (co)polymer of a monomer component including the cycloolefin-based monomer, and a resin obtained by addition-(co)polymerizing the monomer component including the cycloolefin-based monomer.

Examples of the cycloolefin-based monomer included in the monomer component constituting the resin (A) include bicyclic compounds such as norbornene, norbornadiene, tricyclic compounds such as dicyclopentadiene, dihydroxy pentadiene, tetracyclic compounds such as tetracyclododecene, pentacyclic compounds such as cyclopentadiene trimer, heptacyclic compounds such as tetracyclopentadiene, or alkyl (methyl, ethyl, propyl, or butyl) substituents, alkenyl (such as vinyl) substituents, alkylidene (such as ethylidene) substituents, and aryl (such as phenyl, tolyl, or naphthyl) substituents of the polycyclic compounds thereof. Among these, in particular, a norbornene-based monomer selected from the group consisting of the norbornene, the tetracyclododecene, or the alkyl substituents thereof is preferable.

The monomer component constituting the resin (A) may contain other monomers which can be copolymerized with the above-described cycloolefin-based monomers, and preferably contains an alkene monomer, for example. Examples of the alkene monomer include ethylene, propylene, 1-butene, isobutene, 1-hexene, and alpha-olefin. The alkene monomer may be linear or branched.

In addition, the cycloolefin monomer is preferably contained as the monomer component constituting the resin (A) from the viewpoint of a high heat resistance (low pyrolytic property and thermal weight loss property). A ratio of the cycloolefin monomer with respect to the entire monomer component constituting the resin (A) is preferably 5 mol % or greater, more preferably 10 mol % or greater, and furthermore preferably 20 mol % or greater. In addition, the ratio of the cycloolefin monomer with respect to the entire monomer component constituting the resin (A), which is not particularly limited, is preferably 80 mol % or less, and more preferably 70 mol % or less from the viewpoint of solubility and stability with time in a solution.

In addition, a linear or branched alkene monomer may be contained as the monomer component constituting the resin (A). A ratio of the alkene monomer with respect to the entire monomer component constituting the resin (A) is preferably 10 mol % to 90 mol %, more preferably 20 mol % to 85 mol %, and further more preferably 30 mol % to 80 mol % from the viewpoint of solubility and flexibility.

Moreover, for example, as the resin (A), a resin not having a polar group as a resin obtained by polymerizing a monomer component formed of the cycloolefin-based monomer and the alkene monomer is preferable for suppressing generation of gas at high temperature.

The polymerization method and the polymerization conditions when the monomer component is polymerized are not particularly limited, and may be suitably set according to common methods.

Examples of commercially available products that can be used as a resin (A) include "TOPAS" manufactured by POLYPLASTICS Co., Ltd, "APEL" manufactured by Mitsui Chemicals, Inc., "ZEONEX" and "ZEONOR" manufactured by ZEON CORPORATION, and "ARTON" manufactured by JSR Corporation.

A glass transition temperature (Tg) of the resin (A) is preferably 60° C. or higher, and particularly preferably 70° C. or higher. In a case where the glass transition temperature of the resin (A) is 60° C. or higher, when the laminate is exposed to a high temperature environment, it is possible to further suppress softening of the adhesive layer.

The resin (B) is at least one resin selected from the group consisting of the terpene-based resin, the rosin-based resin, and the petroleum-based resin. Specifically, examples of the terpene-based resin include a terpene resin, a terpene phenol resin, a modified terpene resin, a hydrogenated terpene resin, and a hydrogenated terpene phenol resin. Examples of the rosin-based resin include rosin, a rosin ester, hydrogenated rosin, a hydrogenated rosin ester, polymerized rosin, a polymerized rosin ester, and modified rosin. Examples of the petroleum-based resin include an aliphatic or aromatic petroleum resin, a hydrogenated petroleum resin, a denatured petroleum resin, an alicyclic petroleum resin, and a coumarone-indene petroleum resin. Among these, a hydrogenated terpene resin, and a hydrogenated petroleum resin are more preferable.

A softening point of the resin (B), which is not particularly limited, is preferably 80° C. to 160° C. In a case where the softening point of the resin (B) is 80° C. or higher, when the laminate is exposed to a high temperature environment, it is possible to suppress softening, and an adhesive failure does not occur. On the other hands, in a case where the softening point of the resin (B) is 160° C. or lower, when the laminate is peeled, the peeling rate becomes excellent.

A molecular weight of the resin (B), which is not particularly limited, is preferably 300 to 3,000. When the molecular weight of the resin (B) is 300 or greater, heat resistance becomes sufficient, the amount of degasification is reduced under a high temperature environment. On the other hands, in a case where the molecular weight of the resin (B) is 3,000 or less, when the laminate is peeled, the peeling rate becomes excellent. Moreover, the molecular weight of the resin (B) in the exemplary embodiment means a molecular weight in terms of polystyrene measured using a gel permeation chromatography (GPC).

Moreover, as the resin, the resins (A) and (B) may be used as a mixture. By mixing, the heat resistance and the peeling rate become excellent. For example, the mixing ratio between the resin (A) and the resin (B) is preferably (A):(B)=80:20 to 55:45 (mass ratio) since the peeling rate, the heat resistance under the high temperature environment, and flexibility is excellent at this ratio.

Acrylic-Styrene-Based Resin

Examples of the acrylic-styrene-based resin include resins which are polymerized using styrene or styrene derivatives, and (meth)acrylic acid esters as a monomer.

Examples of the (meth)acrylic acid ester include (meth)acrylic acid alkyl ester formed of a chain structure, (meth)acrylic acid ester having an aliphatic ring, and (meth)acrylic acid ester having an aromatic ring. Examples of the (meth)acrylic acid alkyl ester formed of a chain structure include acrylic long chain alkyl ester having an alkyl group with 15 to 20 carbon atoms, and acrylic alkyl ester having an alkyl group with 1 to 14 carbon atoms. Examples of the acrylic long chain alkyl ester include alkyl esters of an acrylic acid or a methacrylic acid in which the alkyl group is an n-pentadecyl group, an n-hexadecyl group, an n-heptadecyl group, an n-octadecyl group, an n-nonadecyl group, or an n-eicosyl group. Moreover, the alkyl group may be branched.

Examples of the acrylic alkyl ester having an alkyl group with 1 to 14 carbon atoms include known acrylic alkyl ester used in an existing acrylic adhesive. For example, alkyl esters of an acrylic acid or a methacrylic acid in which the alkyl group is a methyl group, an ethyl group, a propyl group, a butyl group, a 2-ethylhexyl group, an isooctyl group, an isononyl group, an isodecyl group, a dodecyl group, a lauryl group, and a tridecyl group are exemplified.

Examples of the (meth)acrylic acid ester having an aliphatic ring include cyclohexyl (meth)acrylate, cyclopentyl (meth)acrylate, 1-adamantyl (meth)acrylate, norbornyl (meth)acrylate, isobornyl (meth)acrylate, tricyclodecanyl (meth)acrylate, tetracyclododecanyl (meth)acrylate, and dicyclopentanyl (meth)acrylate, and among these, isobornyl methacrylate, dicyclopentanyl (meth)acrylate are more preferable.

The (meth)acrylic acid ester having an aromatic ring is not particularly limited, and examples of the aromatic ring include a phenyl group, a benzyl group, a tolyl group, a xylyl group, a biphenyl group, a naphthyl group, an anthracenyl group, a phenoxymethyl group, and a phenoxyethyl group. In addition, the aromatic ring may have a linear or a branched alkyl group having 1 to 5 carbon atoms. Specifically, phenoxyethylacrylate is preferable.

Maleimide-Based Resin

Examples of the maleimide-based resin include resins obtained by polymerizing maleimides having an alkyl group such as N-methyl maleimide, N-ethyl maleimide, N-n-propyl maleimide, N-isopropyl maleimide, N-n-butyl maleimide, N-iso-butyl maleimide, N-sec-butyl maleimide, N-tert-butyl maleimide, N-n-pentyl maleimide, N-n-hexyl maleimide, N-n-heptylmaleimide, N-n-octylmaleimide, N-laurylmaleimide, and N-stearyl maleimide; maleimides having an aliphatic hydrocarbon group such as N-cyclopropyl maleimide, N-cyclobutyl maleimide, N-cyclopentyl maleimide, N-cyclohexyl maleimide, N-cycloheptyl maleimide, and N-cyclooctylmaleimide; and aromatic maleimides having an aryl group such as N-phenylmaleimide, N-m-methyl phenyl maleimide, N-o-methyl phenyl maleimide, and N-p-methyl phenyl maleimide, as a monomer.

For example, it is possible to use the cycloolefin copolymer which is a copolymer having a repeating unit represented by the following Chemical formula (8) and a repeating unit represented by the following Chemical formula (9), as a resin of an adhesive component.

[Chemical formula 1]

(8)

(9)

(In Chemical formula (9), n represents 0 or an integer of 1 to 3.)

As the cycloolefin copolymer, APL 8008T, APL 8009T, and APL 6013T (all manufactured by Mitsui Chemicals, Inc.) can be used.

Elastomer

An elastomer preferably includes a styrene unit as a constituent unit of a main chain, and the "styrene unit" may have a substituent. Examples of the substituent include an alkyl group having 1 to 5 carbon atoms, an alkoxy group having 1 to 5 carbon atoms, an alkoxyalkyl group having 1 to 5 carbon atoms, an acetoxy group, and a carboxyl group. In addition, the content of the styrene unit is more preferably in the range of 14% by weight to 50% by weight. Further, the weight average molecular weight (Mw) of the elastomer is preferably in the range of 10,000 to 200,000.

When the content of the styrene unit is in the range of 14% by weight to 50% by weight, and the weight average molecular weight of an elastomer is in the range of 10,000 to 200,000, the adhesive layer can be removed more easily and quickly since it is easily dissolved in hydrocarbon solvents described below. In addition, if the content of the styrene unit and the weight average molecular weight are in the above-described range, excellent resistance is exhibited with respect to resist solvents (for example, PGMEA, PGME and the like), acid (hydrofluoric acid and the like), and alkali (TMAH and the like) to which a wafer is exposed when the wafer is subjected to a resist lithography process.

Moreover, the above-described (meth) acrylic acid ester may be further mixed in the elastomer.

In addition, the content of the styrene unit is more preferably 17% by weight to 40% by weight.

The weight average molecular weight is more preferably in the range of 20,000 to 150,000.

As the elastomer, various elastomers of which the content of the styrene unit is in the range of 14% by weight to 50% by weight, and of which the weight average molecular weight is in the range of 10,000 to 200,000 can be used. Examples of the elastomer include a polystyrene-poly(ethylene/propylene) block copolymer (SEP), a styrene-isoprene-styrene block copolymer (SIS), a styrene-butadiene-styrene block copolymer (SBS), a styrene-butadiene-butylene-styrene block copolymer (SBBS), and hydrogenated products thereof, a styrene-ethylene-butylene-styrene block copolymer (SEBS), a styrene-ethylene-propylene-styrene block copolymer (styrene-isoprene-styrene block copolymer) (SEPS), a styrene-ethylene-ethylene-propylene-styrene block copolymer (SEEPS), a styrene-ethylene-ethylene-propylene-styrene block copolymer (Septon V9461 (manufactured by KURARAY Co., Ltd.)) of which the styrene block is a reaction crosslinking type, and a styrene-ethylene-butylene-styrene block copolymer (having a reactive polystyrene-based hard block, Septon V9827 (manufactured by KURARAY Co., Ltd.)) of which the styrene block is a reaction crosslinking type, and elastomers of which the content of the styrene unit and the weight average molecular weight are in the above range can be used.

In addition, among the elastomers, a hydrogenated product is more preferable. The hydrogenated product has improved stability with respect to heat, and changes in quality such as decomposition and polymerization are unlikely to occur. In addition, the hydrogenated product is more preferable also from the viewpoint of solubility in hydrocarbon-based solvents and resistance to resist solvents.

In addition, among the elastomers, an elastomer of which both terminals are block polymers of styrene is more preferable. This is because higher heat resistance is exhibited by blocking styrene having high heat stability at both terminals thereof.

More specifically, the elastomer is more preferably a hydrogenated product of a block copolymer of styrene and conjugated diene. Stability with respect to heat is improved, and changes in quality such as decomposition and polymerization are unlikely to occur. In addition, higher heat resistance is exhibited by blocking styrene having high heat stability at both terminals thereof. Furthermore, it is more preferable also from the viewpoint of solubility in hydrocarbon-based solvents and resistance to resist solvents.

In addition, examples of commercially-available products which can be used as the elastomer include "Septon (product name)" manufactured by KURARAY Co., Ltd., "HYBRAR (product name)" manufactured by KURARAY Co., Ltd., "Tuftec (product name)" manufactured by Asahi Kasei Corporation, and "DYNARON (product name)" manufactured by JSR Corporation.

In addition, the content of the elastomer in the adhesive constituting the adhesive layer is preferably 50 parts by weight to 99 parts by weight, more preferably 60 parts by weight to 99 parts by weight, most preferably 70 parts by weight to 95 parts by weight if the total amount of an adhesive composition is 100 parts by weight. By setting in these ranges, it is possible to suitably adhere a wafer and the support while maintaining a heat resistance.

In addition, plural kinds of elastomers may be used as a mixture. At least one among plural kinds of elastomers more preferably includes the styrene unit as a constituent unit of a main chain. In addition, it is more preferable that at least one among plural kinds of elastomers of which the content of the styrene unit is in the range of 14% by weight to 50% by weight, or that the weight average molecular weight of an elastomer is in the range of 10,000 to 200,000. In addition, in a case where plural kinds of elastomers are included in the adhesive, as a result of mixing, the content of the styrene unit may be adjusted to be in the above range. For example, when Septon 4033 of Septon (product name) manufactured by KURARAY Co., Ltd. of which the content of the styrene unit is 30% by weight and Septon 2063 of Septon (product name) of which the content of the styrene unit is 13% by weight manufactured by KURARAY Co., Ltd. are mixed at a weight ratio of 1:1, the content of styrene with respect to the entire elastomer contained in the adhesive composition becomes 21% by weight to 22% by weight, and thus, becomes 14% by weight or more. In addition, for example, when an elastomer of which the styrene unit is 10% by weight and an elastomer of which the styrene unit is 60% by weight are mixed at a weight ratio of 1:1, the content of styrene becomes 35% by weight, and thus it is within the above-described range. In addition, it is most preferable that all of the plural kinds of elastomers which are included in the adhesive include the styrene unit in the above-described range, and the weight average molecular weight is in the above-described range.

Diluent Solvent

Examples of a diluent solvent when forming the release layer described below and the adhesive layer include a linear hydrocarbons such as hexane, heptane, octane, nonane, methyloctane, decane, undecane, dodecane, tridecane, branched hydrocarbons having 4 to 15 carbon atoms, cyclic hydrocarbons such as cyclohexane, cycloheptane, cyclooctane, naphthalene, decahydronaphthalene, tetrahydronaphthalene, terpene solvents such as p-menthane, o-menthane, m-menthane, diphenyl menthane, 1,4-terpine, 1,8-terpine, bornane, norbornane, pinane, thujane, carane, longifolene, geraniol, nerol, linalool, citral, citronellol, menthol, isomenthol, neomenthol, α-terpineol, β-terpineol, γ-terpineol, terpinene-1-ol, terpinene-4-ol, dihydroterpinylacetate, 1,4-cineol, 1,8-cineol, borneol, carvone, ionone, thujone, camphor, d-limonene, 1-limonene, and dipentene; lactones such as γ-butyrolactone; ketones such as acetone, methylethylketone, cyclohexanone (CH), methyl-n-pentylketone, methylisopentylketone, and 2-heptanone; polyalcohols such as ethylene glycol, diethylene glycol, propylene glycol, and dipropylene glycol; compounds having a ester bond such as ethyleneglycol monoacetate, diethylene glycol monoacetate, propylene glycol monoacetate, and dipropylene glycol monoacetate, monoalkyl ether such as monomethyl ether, monoethyl ether, monopropyl ether, monobutyl ether of the polyalcohols or the compounds having the ester bond, derivatives of polyalcohols such as compounds having an ether bond such as monophenyl ether (among these, propylene glycol monomethyl ether acetate (PGMEA) and propylene glycol monomethyl ether (PGME) are preferable), cyclic ethers such as dioxane, esters such as methyl lactate, ethyl lactate (EL), methyl acetate, ethyl acetate, butyl acetate, methoxy butyl acetate, methyl pyruvate, ethyl pyruvate, methyl methoxypropionate, and ethyl ethoxypropionate; and aromatic organic solvents such as anisole, ethylbenzyl ether, cresylmethyl ether, diphenyl ether, dibenzyl ether, phenetole, and butylphenyl ether.

Other Components

The adhesive constituting the adhesive layer can further include another miscible substance in such a range that no essential feature is impaired. For example, in the adhesive, various additives commonly used to improve performance of the adhesive such as an additive resin, a plasticizer, an adhesion auxiliary substance, a stabilizer, a colorant, a thermal polymerization inhibitor and a surfactant can further be used.

Support

In the method for processing the mold material according to the present invention, a support may be laminated on the surface opposite to the mold material layer, which is the surface of the adhesive layer. Since the mold material layer and the support are laminated through the adhesive layer, for example, in a case where a workpiece member is placed at the mold material layer, the workpiece member can be easily processed. In other words, since the mold material and the workpiece member are supported by the support, problems such as position shift may be suppressed even when force is added to the mold material and the workpiece member.

In one exemplary embodiment, the support has light transmittance, and as described below, the release layer is formed between the adhesive layer and the support. For this reason, when light is irradiated toward the support, the light passes through the support and reaches the release layer. In addition, the support is not required to transmit all light as long as the support may transmit the light (having a predetermined wavelength) to be absorbed to the release layer.

In addition, the support is for supporting the mold material layer, and at the time of processes such as thinning or transfer of the workpiece member which is placed on the mold material layer, the support may have a strength required in order to prevent damage or deformation of the mold material layer and the workpiece member. From the viewpoints as described above, examples of the support include the support formed of glass, silicon, or an acrylic resin.

A method for laminating the mold material layer to the support is not particularly limited, and for example, first, the adhesive layer described above is provided to the support, and the resultant product may be laminated to the mold material layer, or first, the adhesive layer described above is provided on the mold material layer, and the resultant product may be adhered to the support.

Release Layer

In the method for processing the mold material according to the present invention, the release layer may be formed between the adhesive layer and the support. After necessary processing is performed on the workpiece member, when the support is unnecessary, it is possible to easily separate the support and the mold material layer.

In one exemplary embodiment, the release layer is a layer formed of a material which is changed in quality by absorbing light irradiated through the support. In the specification, "change in quality" of the release layer refers to a phenomenon in which the release layer becomes a state in which the release layer may be broken in response to a slight external force, or the adhesive force with the layers in contact with the release layer is decreased. As a result of change in quality of the release layer generated by absorbing light, the release layer loses strength or adhesiveness before being irradiated with light.

In addition, change of the release layer in quality can be (pyrogenic or non-pyrogenic) decomposition, crosslinking, change in a configuration or dissociation of a functional group (and hardening, degasification, contraction or expansion of the release layer associated with these) due to the energy of the absorbed light. The change of the release layer in quality occurs as a result of the absorption of light by a material constituting the release layer. Thus, the type of the change of the release layer in quality can vary depending on the type of a material constituting the release layer.

For example, the thickness of the release layer is preferably 0.05 µm to 50 µm, and more preferably 0.3 µm to 1 µm. When the thickness of the release layer is within the range of 0.05 µm to 50 µm, a desired change in quality can be generated at the release layer by irradiation with light for a short period of time and irradiation with light having low energy. In addition, the thickness of the release layer is particularly preferably within the range of 1 µm or less from the viewpoint of productivity.

Moreover, another layer may be further formed between the release layer and the support. In this case, the another layer may be constituted by a material which transmits light. Thus, it is possible to suitably add a layer which provides desirable properties to the support without preventing the incidence of light into the release layer. The wavelength of light which can be used is different depending on the type of materials constituting the release layer. Thus, the material constituting the another layer can be suitably selected from materials which can transmit light having a wavelength that can change materials constituting the release layer in quality, however, the materials are not required to transmit all light.

In addition, the release layer is preferably formed only of material having a structure which absorbs light, but the release layer may be formed by adding a material not having a structure which absorbs light in such a range where no essential feature of the present invention is impaired. In addition, a surface of the side opposite to the adhesive layer in the release layer is preferably flat (irregularities are not formed). Thus, it is possible to easily perform formation of the release layer, and to perform uniform adhesion at the time of adhesion.

As the release layer, a layer in which a material constituting the release layer as shown below is formed into a film shape in advance, and then, adhered to the support may be used, and a layer in which a material constituting the release layer is coated on the support, and then, solidified in a film shape may be used. A method for applying a material constituting the release layer on the support can be suitably selected from methods known in the related art such as deposition by a chemical vapor deposition (CVD) method in accordance with the type of the material constituting the release layer.

The release layer may be changed in quality by absorbing light irradiated from a laser. That is, light irradiated to the release layer in order to change the release layer in quality may be one that is irradiated from the laser. Examples of the laser for emitting light which is irradiated to the release layer include laser lights such as solid-state lasers including a YAG laser, a ruby laser, a glass laser, a $YVO_4$ laser, an LD laser, a fiber laser and the like, liquid lasers including a dye laser and the like, gas lasers including a $CO_2$ laser, an excimer laser, an Ar laser, a He—Ne laser and the like, a semiconductor laser and a free electron laser, or non-laser lights. A laser for emitting light which is irradiated to the release layer can be suitably selected depending on materials constituting the release layer, and a laser that emits light having a wavelength that can change materials constituting the release layer in quality may be selected.

Fluorocarbon

The release layer may be formed of fluorocarbon. By being constituted by the fluorocarbon, the release layer is changed in quality by absorbing light, and as a result, the release layer loses strength or adhesiveness before being irradiated with light. Therefore, by applying a slight external force (for example, lifting the support), the release layer is broken, and thus it is possible to easily separate the support and the mold material.

In addition, from one viewpoint, fluorocarbon constituting the release layer can be suitably film-formed by a plasma CVD method. Moreover, the fluorocarbon includes $C_xF_y$ (perfluorocarbon) and $C_xH_yF_z$ (x, y and z are integers). Examples of the fluorocarbon include $CHF_3$, $CH_2F_2$, $C_2H_2F_2$, $C_4F_8$, $C_2F_6$, and $C_5F_8$, but is not limited thereto. In addition, inert gases such as nitrogen, helium or argon, hydrocarbons such as an alkane and an alkene, oxygen, carbon dioxide, and hydrogen may be added to the fluorocarbon used to constitute the release layer, as necessary. In addition, these gases may be used in a mixture of plural gases (for example, mixed gas of fluorocarbon, hydrogen, and nitrogen). In addition, the release layer may be constituted by a single type of fluorocarbon, and the release layer may be constituted by two or more types of fluorocarbons.

The fluorocarbon absorbs light having a wavelength in the specific range depending on the type. By irradiating light having a wavelength in the range that fluorocarbon used in the release layer absorbs, to the release layer, fluorocarbon may be suitably changed in quality. The absorptivity of light in the release layer is preferably 80% or more.

As the light irradiated to the release layer, laser lights such as solid-state lasers including a YAG laser, ruby laser, a glass laser, a $YVO_4$ laser, an LD laser, a fiber laser and the like, liquid lasers including a dye laser and the like, gas lasers including a $CO_2$ laser, an excimer laser, an Ar laser, a He—Ne laser and the like, a semiconductor laser and a free electron laser, or non-laser lights may be used as appropriate in accordance with the wavelength which can be absorbed by fluorocarbon. As the wavelength that can change fluorocarbon in quality, for example, a wavelength in the range of 600 nm or less can be used, and the wavelength is not limited thereto.

Polymer containing structure having light absorption properties in repeating unit thereof.

The release layer may contain a polymer containing a structure having light absorption properties in the repeating unit thereof. The polymer is changed in quality by irradiation of light. The change of the polymer in quality occurs when the structure absorbs light irradiated. As a result of the change of the polymer in quality, the release layer loses the strength and the adhesiveness before being irradiated with light. Therefore, by applying a slight external force (for example, lifting the support), the release layer is broken, and thus it is possible to easily separate the support and the mold material.

The structure having light absorption properties is a chemical structure that changes the polymer containing the structure as the repeat unit in quality by absorbing light. For example, the structure is an atomic group containing a conjugated π-electron system formed of a substituted benzene ring or an unsubstituted benzene ring, a condensed ring or a heterocyclic ring. In more detail, the structure may be a cardo structure, a benzophenone structure present at the side chain of the polymer, diphenyl sulfoxide structure, diphenyl sulfone structure (bis-phenyl sulfone structure), diphenylamine structure or diphenyl structure.

In a case where the structure is present at the side chain of the polymer, the structure can be represented by the following formulas.

[Chemical formula 2]

In the formula, R each independently represent an alkyl group, an aryl group, a halogen, a hydroxyl group, a ketone group, a sulfoxide group, a sulfone group or $N(R^1)$ $(R^2)$ (where $R^1$ and $R^2$ each independently represent a hydrogen atom or an alkyl group having 1 to 5 carbon atoms), Z is absent or represents CO—, —$SO_2$—, —SO— or —NH—, and n represents 0 or an integer of 1 to 5.

In addition, for example, the polymer contains a repeating unit represented by any one of (a) to (d), is represented by (e), or contains a structure of (f) in the main chain, among the following formulas.

[Chemical formula 3]

(f)

In the formulas, 1 is an integer of 1 or greater, m is 0 or an integer of 1 to 2, X is any one of the formulas shown in "Chemical formula 1" described above in (a) to (e), any one of the formulas shown in "Chemical formula 1" described above in (f), or is absent, and $Y_1$ and $Y_2$ represent each independently —CO— or $SO_2$—. 1 is preferably an integer of 10 or less.

Examples of a benzene ring, a condensed ring and a heterocyclic ring shown in "Chemical formula 2" described above include phenyl, substituted phenyl, benzyl, substituted benzyl, naphthalene, substituted naphthalene, anthracene, substituted anthracene, anthraquinone, substituted anthraquinone, acridine, substituted acridine, azobenzene, substituted azobenzene, fluorim, substituted fluorim, fluorimon, substituted fluorimon, carbazole, substituted carbazole, N-alkylcarbazole, dibenzofuran, substituted dibenzofuran, phenanthrene, substituted phenanthrene, pyrene and substituted pyrene. In a case where the exemplified substituent has a substitution, for example, the substituent can be selected from alkyl, aryl, a halogen atom, alkoxy, nitro, aldehyde, cyano, amide, dialkylamino, sulfonamide, imide, carboxylic acid, carboxylic ester, sulfonic acid, sulfonic ester, alkylamino and arylamino.

Among the substituents shown in "Chemical formula 2" described above, examples of a case where a substituent is a fifth substituent having two phenyl groups, and Z is —$SO_2$— include bis(2,4-dihydroxyphenyl)sulfone, bis(3,4-dihydroxyphenyl)sulfone, bis(3,5-dihydroxyphenyl)sulfone, bis(3,6-dihydroxyphenyl)sulfone, bis(4-hydroxyphenyl)sulfone, bis(3-hydroxyphenyl)sulfone, bis(2-hydroxyphenyl)sulfone, and bis(3,5-dimethyl-4-hydroxyphenyl)sulfone.

Among the substituents shown in "Chemical formula 2" described above, examples of a case where a substituent is a fifth substituent having two phenyl groups, and Z is —SO— include, bis(2,3-dihydroxyphenyl)sulfoxide, bis(5-chloro-2,3-dihydroxyphenyl)sulfoxide, bis(2,4-dihydroxyphenyl)sulfoxide, bis(2,4-dihydroxy-6-methylphenyl)sulfoxide, bis(5-chloro-2,4-dihydroxyphenyl)sulfoxide, bis(2,5-dihydroxyphenyl)sulfoxide, bis(3,4-dihydroxyphenyl)sulfoxide, bis(3,5-dihydroxyphenyl)sulfoxide, bis(2,3,4-trihydroxyphenyl)sulfoxide, bis(2,3,4-trihydroxy-6-methylphenyl)-sulfoxide, bis(5-chloro-2,3,4-trihydroxyphenyl)sulfoxide, bis(2,4,6-trihydroxyphenyl)sulfoxide, bis(5-chloro-2,4,6-trihydroxyphenyl)sulfoxide.

Among the substituents shown in "Chemical formula 2" described above, examples of a case where a substituent is a fifth substituent having two phenyl groups, and Z is —C(=O)— include, 2,4-dihydroxybenzophenone, 2,3,4-trihydroxybenzophenone, 2,2',4,4'-tetrahydroxybenzophenone, 2,2',5,6'-tetrahydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,6-dihydroxy-4-methoxybenzophenone, 2,2'-dihydroxy-4,4'-dimethoxybenzophenone, 4-amino-2'-hydroxybenzophenone, 4-dimethylamino-2'-hydroxybenzophenone, 4-diethylamino-2'-hydroxybenzophenone, 4-dimethylamino-4'-methoxy-2'-hydroxybenzophenone, 4-dimethylamino-2',4'-dihydroxybenzophenone, and 4-dimethylamino-3',4'-dihydroxybenzophenone.

In a case where the structure is present at the side chain of the polymer, a proportion occupied by the repeating unit containing the structure in the polymer is in a range in which light transmittance of the release layer becomes 0.001% to 10%. When a polymer is prepared such that the proportion is within the range, the release layer sufficiently absorbs light, and thus the polymer can be reliably and quickly changed in quality. That is, it is easy to remove the support from the mold material layer, and it is possible to reduce light irradiation time required for the removal.

The structures can absorb light having a wavelength in the desired range by selection of the type. For example, the wavelength of light that can be absorbed by the structure is preferably 100 nm to 2,000 nm. In the range, the wavelength of light that can be absorbed by the structure is close to shorter wavelength side, and for example, the wavelength is 100 nm to 500 nm. For example, preferably, by absorbing ultraviolet rays having a wavelength of about 300 nm to 370 nm, the structure can change a polymer containing the structure in quality.

Examples of the light that can be absorbed by the structure are lights emitted from a high-pressure mercury lamp (wavelength: 254 nm to 436 nm), a KrF excimer laser (wavelength: 248 nm), an ArF excimer laser (wavelength: 193 nm), an $F_2$ excimer laser (wavelength: 157 nm), a XeCl laser (wavelength: 308 nm), a XeF laser (wavelength: 351 nm) or a solid-state UV laser (wavelength: 355 nm), or a g-ray (wavelength: 436 nm), a h-ray (wavelength: 405 nm) or an i-ray (wavelength: 365 nm).

The release layer contains a polymer including the structure as a repeating unit, and the release layer can further contain components other than the polymer. Examples of the components include a filler, a plasticizer, and components that can improve the release properties of the support. These components are suitably selected from substances or materials known in the related art which promote or do not inhibit absorption of light by the structure and change of the polymer in quality.

Inorganic Substance

The release layer may be formed of an inorganic substance. By being constituted with the inorganic substance, the release layer is changed in quality by absorbing light, and as a result, the release layer loses strength or adhesiveness before being irradiated with light. Therefore, by applying a slight external force (for example, lifting the support), the release layer is broken, and thus it is possible to easily separate the support and the mold material.

The inorganic substance may be configured to be changed in quality by absorbing light. For example, an inorganic substance of one or more types selected from the group consisting of a metal, a metal compound and carbon can be suitably used. The metal compound refers to a compound containing a metal atom, and for example, the metal compound can be metal oxides, and metal nitrides. Examples of the inorganic substance include an inorganic substance of one or more types selected from the group consisting of gold, silver, copper, iron, nickel, aluminum, titanium, chromium, $SiO_2$, SiN, $Si_3N_4$, TiN and carbon, but the inorganic substance is not limited thereto. Moreover, the carbon can also include allotrope of carbon, and examples of the carbon include a diamond, fullerene, diamond-like carbon, and a carbon nanotube.

The inorganic substance absorbs light having a wavelength in the specific range depending on the type. By irradiating light having a wavelength in the range that the inorganic substance used in the release layer absorbs to the release layer, the inorganic substance is suitably changed in quality.

As the light irradiated to the release layer formed of inorganic substances, laser lights such as solid-state lasers including a YAG laser, a ruby laser, a glass laser, a $YVO_4$ laser, an LD laser, a fiber laser and the like, liquid lasers including a dye laser and the like, gas lasers including a $CO_2$ laser, an excimer laser, an Ar laser, a He—Ne laser and the like, a semiconductor laser and a free electron laser, or non-laser lights may be used as appropriate in accordance with the wavelength which can be absorbed by the inorganic substances.

The release layer formed of the inorganic substance can be formed on the support, for example, by known techniques such as sputtering, chemical vapor deposition (CVD), plating, plasma CVD, spin coating and the like. The thickness of the release layer formed of an inorganic substance is not particularly limited, and it may be a thickness that can sufficiently absorb the light to be used. For example, a film thickness of 0.05 µm to 10 µm is more preferable. In addition, after both sides or one side of an inorganic film (for example, a metal film) formed of an inorganic substance constituting the release layer is coated with an adhesive in advance, adhesion may be performed to the support and the mold material layer.

In a case where a metal film is used as a release layer, reflection of the laser or charging to the film may occur depending on the conditions such as the film quality of the release layer, a type of a laser source, and a laser output. For this reason, it is preferable to take countermeasures for these problems by providing an antireflection film or an antistatic film on and beneath or any one side of the release layer.

Compound Having Structure with Infrared Ray Absorption Property

The release layer may be formed of a compound having a structure with infrared ray absorption property. The compound changes in quality by absorbing the infrared rays. As a result of change of the compound in quality, the release layer loses the strength and the adhesiveness before being irradiated with infrared rays. Therefore, by applying a slight external force (for example, lifting the support), the release layer is broken, and thus it is possible to easily separate the support and the mold material.

Examples of the structure having infrared ray absorption property, or the compounds including the structure having infrared ray absorption property may include alkane, alkene (vinyl, trans, cis, vinylidene, trisubstituted, tetrasubstituted, conjugated, cumulene, cyclo), alkyne (monosubstituted, disubstituted), amonocyclic aromatic group (benzene, monosubstituted, disubstituted, trisubstituted), alcohols and phenols (free OH, intramolecular hydrogen bond, intermolecular hydrogen bond, saturated secondary, saturated tertiary, unsaturated secondary, unsaturated tertiary), acetal, ketal, aliphatic ether, aromatic ether, vinyl ether, oxirane ring ether, ether peroxides, ketone, dialkyl carbonyl, aromatic carbonyl, enol of 1,3-diketone, o-hydroxy aryl ketone, dialkyl aldehyde, aromatic aldehyde, carboxylic acid (dimer, carboxylate anion), formic acid ester, acetic acid ester, conjugated ester, non-conjugated ester, aromatic ester, lactone (β-, γ-, δ-), aliphatic acid chloride, aromatic acid chloride, acid anhydride (conjugated, non-conjugated, cyclic, acyclic), primary amide, secondary amide, lactam, primary amine (aliphatic, aromatic), secondary amine (aliphatic, aromatic), tertiary amine (aliphatic, aromatic), primary amine salt, secondary amine salt, tertiary amine salt, ammonium ion, aliphatic nitrile, aromatic nitrile, carbodiimide, aliphatic isonitrile, aromatic isonitrile, isocyanic ester, thiocyanic ester, aliphatic isothiocyanic ester, aromatic isothiocyanic ester, aliphatic nitro compounds, aromatic nitro compounds, nitroamine, nitrosoamine, nitric ester, nitrite ester, a nitroso bond (aliphatic, aromatic, monomer, dimer), sulfur compounds such as mercaptan, thiophenol and thiol acid, a thiocarbonyl group, sulfoxide, sulfone, sulfonyl chloride, primary sulfonamide, secondary sulfonamide, sulfuric ester, a carbon-halogen bond, a Si-$A^1$ bond ($A^1$ is H, C, O, or a halogen), a P-$A^2$ bond ($A^2$ is H, C, or O) or a Ti—O bond.

Examples of the structure including the carbon-halogen bond described above include —$CH_2Cl$, —$CH_2Br$, —$CH_2I$, —$CF_2$—, —$CF_3$, —CH=$CF_2$, —CF=$CF_2$, aryl fluoride, and aryl chloride.

Examples of the structure including the Si-$A^1$ bond described above include SiH, $SiH_2$, $SiH_3$, Si—$CH_3$, Si—$CH_2$—, Si—$C_6H_5$, a SiO— aliphatic group, Si—$OCH_3$, Si—$OCH_2CH_3$, Si—$OC_6H_5$, Si—O—Si, Si—OH, SiF, $SiF_2$, and $SiF_3$. As the structure including the Si-$A^1$ bond, in particular, a siloxane skeleton and a silsesquioxane skeleton are preferably formed.

Examples of the structure including the P-$A^2$ bond described above include PH, $PH_2$, P—$CH_3$, P—$CH_2$—, P—$C_6H_5$, $A^3_3$-P—O ($A^3$ represents an aliphatic group or an aromatic group), ($A^4O)_3$—P—O ($A^4$ represents alkyl), P—$OCH_3$, P—$OCH_2CH_3$, P—$OC_6H_5$, P—O—P, P—OH, and O=P—OH.

The above-described structures can absorb infrared rays having a wavelength in the desired range by selecting the type thereof. Specifically, for example, the wavelength of infrared rays that can be absorbed by the structure is in the range of 1 µm to 20 µm, and the structure can more preferably absorb the wavelength in the range of 2 µm to 15 µm. Furthermore, in a case where the structure is a Si—O bond, a Si—C bond and a Ti—O bond, the wavelength can be in the range of 9 µm to 11 µm. Moreover, those skilled in the art can easily understand the wavelength of infrared rays that can be absorbed by each structure. For example, as an absorption band in each structure, pp. 146 to 151 of non-patent literature: "Spectrometric identification of organic compounds—combined use of MS, IR, NMR, UV—(5th edition)", written by Siverstein, Bassler and Morrill (published in 1992) can be referred to.

The compound having a structure with infrared ray absorption property used in the formation of the release layer is not particularly limited as long as it has the structure as described above, can be dissolved in a solvent for coating, and can be solidified to form a solid layer. However, in order to easily separate the support and the mold material layer by effectively changing the compound in the release layer in quality, it is preferable that absorption of infrared rays in the release layer be great, that is, the transmittance of infrared rays when the infrared rays are irradiated in the release layer be low. Specifically, the transmittance of infrared rays in the release layer is preferably less than 90%, and the transmittance of infrared rays is more preferably less than 80%.

For example, as the compound having a siloxane skeleton, a resin which is a copolymer having a repeating unit represented by the following Chemical formula (1) and a repeating unit represented by the following Chemical formula (2), or a resin which is a copolymer having a repeating unit represented by the following Chemical formula (1) and a repeating unit derived from acrylic compound can be used.

[Chemical formula 4]

(1)

(2)

In the Chemical formula (2), $R^3$ represents a hydrogen atom, an alkyl group having 10 carbon atoms or less, or an alkoxy group having 10 carbon atoms or less.

Among these, as the compound having a siloxane skeleton, tert-butylstyrene (TBST)-dimethylsiloxane copolymer which is a copolymer having a repeating unit represented by the above Chemical formula (1) and a repeating unit represented by the following Chemical formula (3) is more preferable, and TBST-dimethylsiloxane copolymer which includes a repeating unit represented by the above Chemical formula (1) and a repeating unit represented by the following Chemical formula (3) at a ratio of 1:1 is even more preferable.

[Chemical formula 5]

(3)

In addition, as the compound having a silsesquioxane skeleton, for example, a resin which is a copolymer having a repeating unit represented by the following Chemical formula (4) and a repeating unit represented by the following Chemical formula (5) can be used.

[Chemical formula 6]

(4)

(5)

In Chemical formula (4), $R^4$ represents a hydrogen atom or an alkyl group having 1 carbon atom to 10 carbon atoms, and in Chemical formula (5), $R^5$ represents an alkyl group having 1 carbon atom to 10 carbon atoms, or a phenyl group.

In addition to the above compounds, as the compound having the silsesquioxane skeleton, each silsesquioxane resin disclosed in JP-A-2007-258663 (published in Oct. 4, 2007), JP-A-2010-120901 (published in Jun. 3, 2010), JP-A-2009-263316 (published in Nov. 12, 2009), and JP-A-2009-263596 (published in Nov. 12, 2009) can be suitably used.

Among these, as the compound having the silsesquioxane skeleton, a copolymer having a repeating unit represented by the following Chemical formula (6) and a repeating unit represented by the following Chemical formula (7) is more preferable, and a copolymer which includes a repeating unit represented by the following Chemical formula (6) and a repeating unit represented by the following Chemical formula (7) at a ratio of 7:3 is further preferable.

[Chemical formula 7]

(6)

(7)

A polymer having the silsesquioxane skeleton can have a random structure, a ladder structure, and a basket structure, and may have any of the structures.

In addition, examples of the compound containing a Ti—O bond include (i) alkoxy titanium such as tetra-i-propoxy titanium, tetra-n-butoxy titanium, tetrakis(2-ethylhexyloxy)titanium, and titanium-1-propoxy octylene glycolate; (ii) chelate titanium such as di-i-propoxy bis(acetylacetonato)titanium, and propanedioxy titanium bis(ethyl acetoacetate); (iii) titanium polymers such as i-$C_3H_7O$—[—Ti(O-i-$C_3H_7)_2$—O—]$_n$-i-$C_3H_7$, and n-$C_4H_9O$—[—Ti(O-n-$C_4H_9)_2$—O—]$_n$-n-$C_4H_9$; (iv) titanium acylates such as tri-n-butoxy titanium monostearate, titanium stearate, di-i-propoxy titanium diisostearate, and (2-n-butoxycarbonyl benzoyloxy) tributoxy titanium; and (v) water-soluble titanium compounds such as di-n-butoxy bis(triethanolaminato) titanium.

Among these, as the compound containing a Ti—O bond, di-n-butoxy-bis(triethanolaminato) titanium (Ti(O$C_4H_9)_2$[O$C_2H_4$N($C_2H_4$OH)$_2$]$_2$) is preferable.

The release layer described above contains a compound having a structure with infrared ray absorption property, and the release layer can further contain components other than the above-described compounds. Examples of the components include a filler, a plasticizer, and components that can improve the release properties of the support. These components are suitably selected from substances or materials known in the related art which promote or do not inhibit absorption of infrared rays by the structure and change of compounds in quality.

Infrared Ray Absorbing Substance

The release layer may contain an infrared ray absorbing substance. By being constituted so as to contain the infrared ray absorbing substance, the release layer is changed in quality by absorbing light, and as a result, the release layer loses strength or adhesiveness before being irradiated with light. Therefore, by applying a slight external force (for example, lifting the support), the release layer is broken, and thus it is possible to easily separate the support and the mold material.

The infrared ray absorbing substance may be configured to be changed in quality by absorbing infrared rays. For example, carbon black, iron particles, or aluminum particles can be suitably used. The infrared ray absorbing substance absorbs light having a wavelength in the specific range depending on the type. By irradiating light having a wavelength in the range that the infrared ray absorbing substance used in the release layer absorbs to the release layer, the infrared ray absorbing substance is suitably changed in quality.

Method for Manufacturing Structural Body

A method for manufacturing structural body including a heating step in which a mold material layer formed of the mold material is heated, and gas is discharged from the mold material constituting the mold material layer is also within the scope of the invention. For example, the structural body may be one in which the mold material layer subjected to the heating step is placed on the substrate described above, or may be one in which the support described above and the like are further laminated.

One Exemplary Embodiment of Method for Processing Mold Material

Next, one exemplary embodiment of the method for processing the mold material according to the present invention will be described with reference to FIGS. 1A to 1G. FIGS. 1A to 1G are schematic cross-sectional diagrams illustrating a flow of processing in the method for processing the mold material according to the exemplary embodiment. In the exemplary embodiment, a thinning processing in which a chip placed on the mold material layer is polished is performed.

Figure 1A:
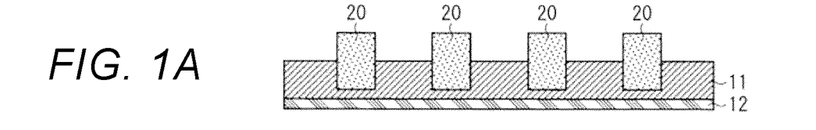
FIGS. 1A to 1G are schematic cross-sectional diagrams illustrating a flow of processing in one exemplary embodiment of a method for processing of the present invention.

As shown in FIG. 1A, in the present exemplary embodiment, a mold material layer 11 is provided on a substrate 12. A plurality of chips (workpiece member) 20 are placed on the mold material layer 11.

Here, the mold material layer 11, the substrate 12, and the chip 20 are subjected to the heating step. Thus, gas is generated from the mold material layer 11.

Figure 1B:
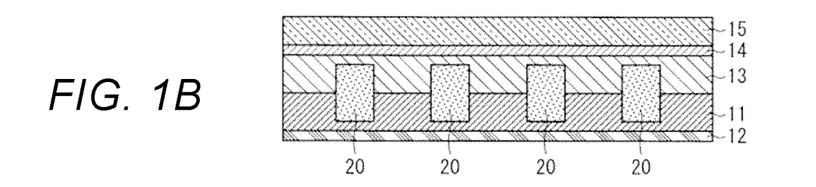

Next, as shown in FIG. 1B, a support plate (support) 15 is laminated. A release layer 14 and an adhesive layer 13 are provided to the support plate 15 in advance.

When the support plate 15 is laminated over the mold material layer 11, thermocompression bonding is performed. If the heating step described above is not performed, an adverse effect in which, here, gas is generated, and the support plate 15 cannot be sufficiently adhered occurs. However, in the present invention, since in the heating step, gas is discharged from the mold material layer 11 in advance, such an adverse effect can be suppressed.

Figure 1C:
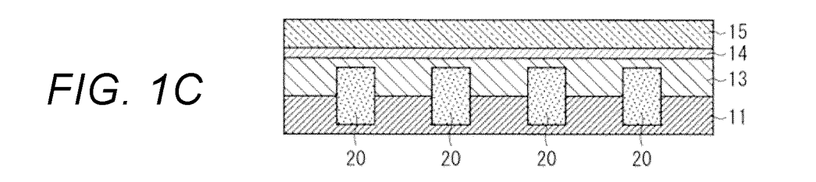

Next, as shown in FIG. 1C, the substrate 12 is stripped.

Figure 1D:
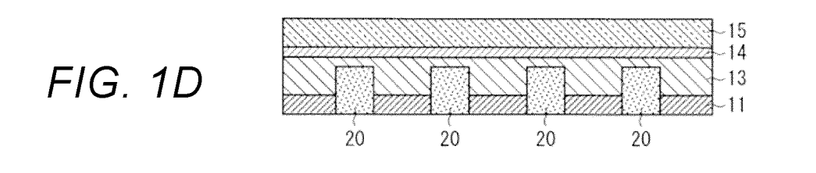

Next, as shown in FIG. 1D, the surface of the mold material layer 11 on which the substrate 12 was provided is polished. Thus, the chip 20 is polished, and therefore, the chip 20 can be thinned.

Figure 1E:
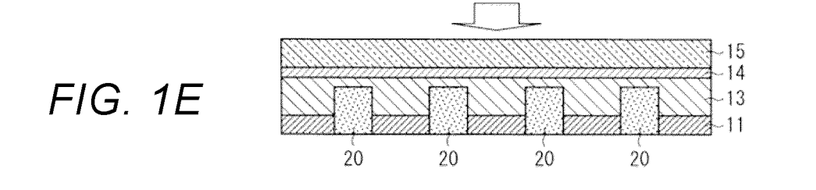

Next, as shown in FIG. 1E, laser light is irradiated toward the surface of the support plate 15 of an opposite side to the mold material layer 11. Thus, the release layer 14 is changed in quality, and the adhesive force between the adhesive layer 13 and the support plate 15 is decreased.

Figure 1F:
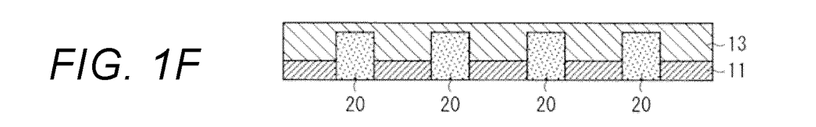

Next, as shown in FIG. 1F, the support plate 15 is stripped. As described above, since the release layer 14 is changed in quality by irradiating laser light thereon, the support plate 15 can be easily stripped from the adhesive layer 13.

Figure 1G:
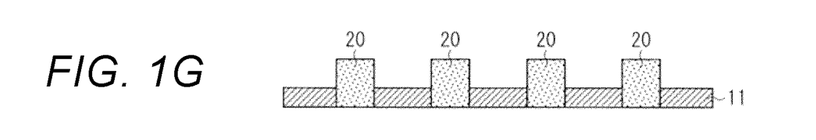

Next, as shown in FIG. 1G, using a solvent which dissolves the adhesive constituting the adhesive layer 13, the adhesive layer 13 is removed. Thus, the mold material layer 11 in which the thinned chip 20 is placed is obtained. When a user wants to use the chip 20, the chip 20 is taken out from the mold material layer 11, and can be suitably used.

The present invention is not limited to the exemplary embodiment described above, and may be altered within the scope of the aspects. That is, an embodiment derived from a proper combination of technical means disclosed in different embodiments with the above description is encompassed in the technical scope of the present invention.

EXAMPLES

Example 1

A Case where the Mold Material is Coated on the Substrate Having a High Thermal Conductivity The mold material layer was formed on the substrate. In addition, the adhesive was coated on the side of the support, and the resultant product was adhered to the mold material layer. The thickness of the adhesive was 200 μm. After baking at the time of coating was performed at 90° C., 160° C., and 220° C. for 12 minutes, respectively, the heating step after the coating film formation was performed at 215° C. for 20 minutes, and by this, gas was discharged. Adhesion was performed by pressing with 1 ton at 215° C. for 10 minutes. The pressure in the adhesion chamber at the time of starting the adhesion was 1.2 Pa. After the adhesion was started, gas was not generated since gas was discharged in advance, and the pressure was lowered to 0.6 Pa.

Comparative Example 1

The operation was performed in the same manner as in Example 1 except that the heating step of Example 1 (the heating step at 215° C. for 20 minutes after the coating film formation) was omitted.

Since gas was generated during adhesion, the pressure in the adhesion chamber was maintained to be 1.2 Pa, or became 1.2 Pa to 2.4 Pa, and thus, it was not possible to perform the adhesion under reduced pressure.

Example 2

A Case where Mold Material is Coated on Substrate Having a Low Thermal Conductivity The adhesive was coated on the mold material layer of the substrate side, and the thickness of the adhesive layer was set to 70 μm. Baking at the time of coating was performed at 90° C., 160° C., and 220° C. for 6 minutes, respectively. The heating step after the coating film formation was performed at 215° C. for 15 minutes, and adhesion was performed by pressing with 4 tons at 215° C. for 10 minutes. Other operation was performed in the same manner as in Example 1. The pressure in the adhesion chamber at the time of starting the adhesion was 1.2 Pa, and after the adhesion was started, the pressure was lowered to 0.6 Pa since gas was not generated.

Comparative Example 2

The operation was performed in the same manner as in Example 2 except that the heating step of Example 2 (the heating step at 215° C. for 15 minutes after the coating film formation) was omitted. As a result, since gas was generated during adhesion, the pressure in the adhesive chamber was maintained to be 1.2 Pa, or became 1.2 Pa to 2.4 Pa, and thus, it was not possible to perform the adhesion under reduced pressure.

The method for processing the mold material according to the present invention can be suitably used, for example, in a process of manufacturing a miniaturized semiconductor device.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for processing a mold material such that the mold material adheres to a support with sufficient strength for further processing, comprising:
    heating a mold material layer formed of the mold material to discharge gas from the mold material constituting the mold material layer;
    providing an adhesive layer on a surface of the mold material layer, after the heating, wherein a thickness of the adhesive layer is in the range of 10 μm to 300 μm; and
    laminating the support on a surface of the adhesive layer opposite to the surface of the adhesive layer which faces the mold material layer,
    wherein the heating is performed for 15 minutes or more,
    wherein the heating is performed at a temperature of 215° C. or higher and 250° C. or lower,
    wherein the method further comprises raising a temperature in a range from 90° C. to 220° C. before the heating so that the mold material layer is baked before the heating,
    wherein the adhesive layer contains at least one adhesive selected from the group consisting of an acrylic adhesive, a novolac adhesive, a naphthoquinone adhesive, a hydrocarbon adhesive, a polyimide adhesive, and an elastomer including a styrene unit as a constituent unit of a main chain,
    wherein a release layer is formed between the adhesive layer and the support, and
    wherein the release layer (i) is formed of fluorocarbon, (ii) is formed of an organic compound having a structure with infrared ray absorption property, or (iii) contains an infrared ray absorbing substance selected from the group consisting of carbon black and iron particles, wherein the release layer does not comprise a polymer.

2. The method for processing a mold material according to claim 1, wherein in the heating step, the mold material is heated under a reduced pressure environment whose pressure is lower than an atmospheric pressure.

3. The method for processing a mold material according to claim 1, wherein a workpiece member to be processed is placed on a surface of the mold material layer.

4. The method for processing a mold material according to claim 1, wherein the mold material layer is formed on a substrate.

5. A method for manufacturing a structural body such that a mold material adheres to a support with sufficient strength for further processing, comprising:
heating a mold material layer formed of the mold material to discharge gas from the mold material constituting the mold material layer;
providing an adhesive layer on a surface of the mold material layer, after the heating, wherein a thickness of the adhesive layer is in the range of 10 µm to 300 µm; and
laminating the support on a surface of the adhesive layer opposite to the surface of the adhesive layer which faces the mold material layer,
wherein the heating is performed for 15 minutes or more,
wherein the heating is performed at a temperature of 215° C. or higher and 250° C. or lower,
wherein the method further comprises raising a temperature in a range from 90° C. to 220° C. before the heating so that the mold material layer is baked before the heating,
wherein the adhesive layer contains at least one adhesive selected from the group consisting of an acrylic adhesive, a novolac adhesive, a naphthoquinone adhesive, a hydrocarbon adhesive, a polyimide adhesive, and an elastomer including a styrene unit as a constituent unit of a main chain,
wherein a release layer is formed between the adhesive layer and the support, and
wherein the release layer (i) is formed of fluorocarbon, (ii) is formed of an organic compound having a structure with infrared ray absorption property, or (iii) contains an infrared ray absorbing substance selected from carbon black and iron particles, wherein the release layer does not comprise a polymer.

6. The method for processing a mold material according to claim 4, wherein the substrate is wafer, glass or silicon.

7. The method for processing a mold material according to claim 1, wherein the adhesive is an elastomer resin including a styrene unit as a constituent unit of a main chain.

8. The method for processing a mold material according to claim 7, wherein the content of the styrene unit contained in the elastomer resin is in a range of 14% by weight to 50% by weight.

9. The method for processing a mold material according to claim 7, wherein a weight average molecular weight (Mw) of the elastomer resin is in a range of 10,000 to 200,000.

10. The method for processing a mold material according to claim 7, wherein the elastomer resin is a hydrogenated product.

11. The method for processing a mold material according to claim 7, wherein the elastomer resin has terminals that are block polymers of styrene.

12. The method for processing a mold material according to claim 7, wherein the elastomer resin is a hydrogenated product of a block copolymer of styrene and conjugated diene.

13. The method for processing a mold material according to claim 5, wherein the adhesive is an elastomer including a styrene unit as a constituent unit of a main chain.

14. The method for processing a mold material according to claim 13, wherein the content of the styrene unit contained in the elastomer resin is in a range of 14% by weight to 50% by weight.

15. The method for processing a mold material according to claim 13, wherein a weight average molecular weight (Mw) of the elastomer resin is in a range of 10,000 to 200,000.

16. The method for processing a mold material according to claim 13, wherein the elastomer resin is a hydrogenated product.

17. The method for processing a mold material according to claim 13, wherein the elastomer resin has terminals that are block polymers of styrene.

18. The method for processing a mold material according to claim 13, wherein the elastomer resin is a hydrogenated product of a block copolymer of styrene and conjugated diene.

* * * * *